(12) United States Patent
Tolpygo et al.

(10) Patent No.: US 11,479,846 B2
(45) Date of Patent: Oct. 25, 2022

(54) THERMAL BARRIER COATINGS FOR TURBINE ENGINE COMPONENTS

(71) Applicant: HONEYWELL INTERNATIONAL INC., Morristown, NJ (US)

(72) Inventors: Vladimir K. Tolpygo, Scottsdale, AZ (US); Wil Baker, Phoenix, AZ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 141 days.

(21) Appl. No.: 14/312,869

(22) Filed: Jun. 24, 2014

(65) Prior Publication Data

US 2015/0191828 A1    Jul. 9, 2015

Related U.S. Application Data

(60) Provisional application No. 61/924,342, filed on Jan. 7, 2014.

(51) Int. Cl.
*C09D 1/00* (2006.01)
*F01D 5/28* (2006.01)
(Continued)

(52) U.S. Cl.
CPC .......... *C23C 14/083* (2013.01); *C04B 35/488* (2013.01); *C04B 35/495* (2013.01);
(Continued)

(58) Field of Classification Search
CPC ........... B32B 15/04; B32B 9/04; B32B 18/00; B32B 9/00; B32B 9/005; B32B 9/041; C23C 28/00; C23C 28/3455; C23C 14/08; C23C 14/083; C23C 4/02; C23C 4/10; C23C 4/11; C23C 4/12; C23C 28/34; C23C 28/345; C04B 35/48; C04B 35/488; C04B 35/495; C04B 35/50; C04B 35/505;
(Continued)

(56) References Cited

U.S. PATENT DOCUMENTS 4,321,310 A    3/1982   Ulion et al.
4,321,311 A    3/1982   Strangman
(Continued)

FOREIGN PATENT DOCUMENTS

CN    101397214 A    4/2009
EP    1550645 A2    7/2005
(Continued)

OTHER PUBLICATIONS

EP Search Report for Application No. EP 14187978.3, dated Jun. 15, 2015.
(Continued)

*Primary Examiner* — Maria V Ewald
*Assistant Examiner* — Ethan A. Utt
(74) *Attorney, Agent, or Firm* — Lorenz & Kopf, LLP

(57) ABSTRACT

Thermal barrier coatings consist of a tantala-zirconia mixture that is stabilized with two or more stabilizers. An exemplary thermal barrier coating consists of, by mole percent: about 8% to about 30% $YO_{1.5}$; about 8% to about 30% $YbO_{1.5}$ or $GdO_{1.5}$ or combination thereof; about 8% to about 30% $TaO_{2.5}$; about 0% to about 10% $HfO_2$; and a balance of $ZrO_2$.

14 Claims, 2 Drawing Sheets

(51) Int. Cl.

| | | |
|---|---|---|
| *C04B 35/495* | (2006.01) | |
| *C04B 35/50* | (2006.01) | |
| *C04B 35/622* | (2006.01) | |
| *C04B 35/488* | (2006.01) | |
| *C04B 35/505* | (2006.01) | |
| *C23C 14/08* | (2006.01) | |
| *C23C 14/30* | (2006.01) | |
| *C23C 30/00* | (2006.01) | |
| *C23C 4/02* | (2006.01) | |
| *C23C 4/11* | (2016.01) | |
| *C23C 4/134* | (2016.01) | |

(52) U.S. Cl.
CPC ............ *C04B 35/50* (2013.01); *C04B 35/505* (2013.01); *C04B 35/62222* (2013.01); *C09D 1/00* (2013.01); *C23C 4/02* (2013.01); *C23C 4/11* (2016.01); *C23C 4/134* (2016.01); *C23C 14/30* (2013.01); *C23C 30/00* (2013.01); *F01D 5/288* (2013.01); *C04B 2235/3224* (2013.01); *C04B 2235/3225* (2013.01); *C04B 2235/3244* (2013.01); *C04B 2235/3251* (2013.01); *C04B 2235/72* (2013.01); *C04B 2235/765* (2013.01); *C04B 2235/80* (2013.01); *C04B 2235/9607* (2013.01); *F05D 2300/2118* (2013.01); *Y02T 50/60* (2013.01)

(58) Field of Classification Search
CPC ... C04B 35/482; C04B 35/484; C04B 35/486; C04B 35/4885
USPC ..... 428/688–702, 699–702, 469, 472, 472.1; 501/94, 102, 103, 126, 134, 152; 106/286.1, 286.2, 286.4, 286.8; 252/62; 416/241 R, 241 B
See application file for complete search history.

(56) References Cited

U.S. PATENT DOCUMENTS

| | | |
|---|---|---|
| 4,401,697 A | 8/1983 | Strangman |
| 4,405,659 A | 9/1983 | Strangman |
| 4,507,394 A | 3/1985 | Mase et al. |
| 4,916,113 A | 4/1990 | Newkirk et al. |
| 5,238,752 A | 8/1993 | Duderstadt et al. |
| 5,514,482 A | 5/1996 | Strangman |
| 6,025,078 A | 2/2000 | Rickerby et al. |
| 6,177,200 B1 | 1/2001 | Maloney |
| 6,284,323 B1 | 9/2001 | Maloney |
| 6,333,118 B1 | 12/2001 | Alperine et al. |
| 6,387,539 B1 | 5/2002 | Subramanian |
| 6,461,108 B1 | 10/2002 | Lee et al. |
| 6,482,437 B2 | 11/2002 | Debregeas et al. |
| 6,482,537 B1 | 11/2002 | Strangman et al. |
| 6,586,115 B2 | 7/2003 | Rigney et al. |
| 6,686,060 B2 | 2/2004 | Bruce et al. |
| 6,730,422 B2 | 5/2004 | Litton et al. |
| 6,790,486 B2 | 9/2004 | Movchan et al. |
| 6,803,135 B2 | 10/2004 | Liu et al. |
| 6,808,799 B2 | 10/2004 | Darolia et al. |
| 6,858,334 B1 | 2/2005 | Gorman et al. |
| 6,869,703 B1 | 3/2005 | Spitsberg et al. |
| 6,875,529 B1 | 4/2005 | Spitsberg et al. |
| 6,887,595 B1 | 5/2005 | Darolia et al. |
| 6,890,668 B2 | 5/2005 | Bruce et al. |
| 6,916,561 B1 | 7/2005 | Spitsberg et al. |
| 6,924,040 B2 | 8/2005 | Maloney |
| 6,930,066 B2 | 8/2005 | Subramanian |
| 6,933,066 B2 | 8/2005 | Nagaraj et al. |
| 6,960,395 B2 | 11/2005 | Spitsberg et al. |
| 6,979,498 B2 | 12/2005 | Darolia et al. |
| 6,982,126 B2 | 1/2006 | Darolia et al. |
| 7,001,859 B2 | 2/2006 | Zhu et al. |
| 7,087,266 B2 | 8/2006 | Darolia et al. |
| 7,115,327 B2 | 10/2006 | Spitsberg et al. |
| 7,186,466 B2 | 3/2007 | Zhu et al. |
| 7,226,672 B2 | 6/2007 | Litton et al. |
| 7,255,940 B2 | 8/2007 | Spitsberg et al. |
| 7,309,530 B2 | 12/2007 | Spitsberg et al. |
| 7,351,482 B2 | 4/2008 | Boutwell et al. |
| 7,354,663 B2 | 4/2008 | Torigoe et al. |
| 7,364,802 B2 | 4/2008 | Spitsberg et al. |
| 7,700,508 B1 | 4/2010 | Zhu et al. |
| 7,785,671 B2 | 8/2010 | Matsumoto et al. |
| 7,824,744 B2 | 11/2010 | Darolia et al. |
| 7,859,100 B2 | 12/2010 | Torigoe et al. |
| 7,862,901 B2 | 1/2011 | Darolia et al. |
| 8,021,762 B2 | 9/2011 | Taylor et al. |
| 8,187,717 B1 | 5/2012 | Xie et al. |
| 8,449,994 B2 | 5/2013 | Tolpygo |
| 8,574,721 B2 | 11/2013 | Gero et al. |
| 8,592,044 B2 | 11/2013 | Birkner et al. |
| 2005/0003097 A1 | 1/2005 | Philip et al. |
| 2005/0026770 A1* | 2/2005 | Zhu ............... C04B 35/486 501/103 |
| 2005/0036891 A1 | 2/2005 | Spitsberg et al. |
| 2005/0238894 A1 | 10/2005 | Gorman et al. |
| 2008/0107920 A1 | 5/2008 | Rowe et al. |
| 2009/0110953 A1 | 4/2009 | Margolies |
| 2010/0136349 A1* | 6/2010 | Lee ................ C23C 28/3455 428/702 |
| 2010/0154425 A1 | 6/2010 | Litton et al. |
| 2010/0159150 A1 | 6/2010 | Kirby et al. |
| 2010/0159262 A1 | 6/2010 | Fu et al. |
| 2010/0159270 A1 | 6/2010 | Fu et al. |
| 2010/0327213 A1 | 12/2010 | Tolpygo |
| 2011/0142607 A1 | 6/2011 | Ciro et al. |
| 2011/0262770 A1 | 10/2011 | Torigoe et al. |
| 2011/0300357 A1 | 12/2011 | Witz et al. |
| 2012/0195744 A1 | 8/2012 | Naik et al. |
| 2013/0209786 A1 | 8/2013 | Allen et al. |
| 2013/0224457 A1 | 8/2013 | Lee |

FOREIGN PATENT DOCUMENTS

| | | |
|---|---|---|
| EP | 1683773 A2 | 7/2006 |
| WO | 0149892 A1 | 7/2001 |
| WO | 2010071720 A1 | 6/2010 |
| WO | 2012012431 A1 | 1/2012 |
| WO | 2013026870 A1 | 2/2013 |

OTHER PUBLICATIONS

Guo et al.; Thermophysical properties of Yb2O3 doped Gd2Zr2O7 and thermal cycling durability of (Gd0.9Yb0.1) 2Zr2O7/YSZ thermal barrier coatings; ScienceDirect; Journal of the European Ceramic Society 34 (2014) 1255-1263; copyright 2013 Elsevier Ltd.

Tsipas, S.A.; Effects of dopants on the phase stability of zirconia-based plasma sprayed thermal barrier coatings; ScienceDirect, Journal of the European Ceramic Society 30 (2010) 61-72; copyright 2009 Elsevier Ltd.

Shen et al.; Low thermal conductivity without oxygen vacancies in equimolar YO1.5 + TaO2.5- and YbO1.5 + TaO2.5-stabilized tetragonal zirconia ceramics; ScienceDirect, Acta Materialia 58 (2010) 4424-4431; copyright 2010 Published by Elsevier Ltd. on behalf of Acta Materialia Inc.

Stecura, S.; New ZrO2-Yb2O3 plasma-sprayed coatings for thermal barrier applications; Metallurgical and Protective Coatings; Thin Solid Films, 150 (1987) 15-40; Lewis Research Center, National Aeronautics and Space Administration, OH; copyright Elsevier Sequoia.

Sulzer Metco; Zirconia Gadolinia Ytterbia Yttria Agglomerated and Sintered Thermal Spray Powder; Material Product Data Sheet; Thermal Spray Powder Products: Metco 206A; DSMTS-0099.0; copyright 2012 Sulzer Metco.

Proquest; A study of the zirconia-yttria-tantala system as a potential thermal barrier oxide; [Retrieved from internet http://search.proquest.com//docview/305349149] Jan. 13, 2014.

Proquest; Effect of nanpcrystalline grain size and point defects on the properties of yyttria, tanala and niobia doped zirconias for TBC

(56) References Cited

OTHER PUBLICATIONS applications [Retrieved from internet: http://search.proquest.com//docview/250123442] Jan. 13, 2014.

Sanchez, M.; Investigating High Performance Ceramic Coatings for Next Generation Gas Turbines; presented at the 2013 SHPE Conference.

Kim, D.; Effect of $Ta_2O_5$, $Nb_2O_5$, and $HfO_2$, Alloying on the Transformability of $Y_2O_3$-Stabilized Tetragonal $Zr_2x$; Department of Materials Science and Engineering, The University of Michigan, Manuscript No. 198740; J.Am. Ceram. Soc., 73 (1) 115-20 (1990).

Almeida, D.S., et al.; Electron Beam-Physical Vapour Deposition of Zirconia Co-Doped With Yttria and Niobia.

* cited by examiner

THERMAL BARRIER COATINGS FOR TURBINE ENGINE COMPONENTS

CROSS-REFERENCE TO RELATED APPLICATIONS

This application claims the benefit of U.S. Provisional Application No. 61/924,342, filed Jan. 7, 2014.

STATEMENT REGARDING FEDERALLY SPONSORED RESEARCH

The present invention was developed under a contract from the Federal Aviation Administration, contract no. DTFAWA-10-C-00040. Accordingly, the Government has certain rights in the invention.

TECHNICAL FIELD

The inventive subject matter generally relates to thermal barrier coatings, and more particularly relates to thermal barrier coatings for turbine engine components.

BACKGROUND

Turbine engines are used as the primary power source for various kinds of aircraft. Turbine engines may also serve as auxiliary power sources that drive air compressors, hydraulic pumps, and industrial electrical power generators. Most turbine engines generally follow the same basic power generation procedure. Specifically, compressed air is mixed with fuel and burned, and the expanding hot combustion gases are directed against stationary turbine vanes in the engine. The stationary turbine vanes turn the high velocity gas flow partially sideways to impinge onto turbine blades mounted on a rotatable turbine disk. The force of the impinging gas causes the turbine disk to spin at a high speed. Some turbine engines, such as jet propulsion engines, use the power created by the rotating turbine disk to draw more air into the engine, and the high velocity combustion gas is passed out of the turbine engine to create a forward thrust. Other engines use this power to turn one or more propellers, electrical generators, or other devices.

Because fuel efficiency improves as engine operating temperatures increase, turbine components such as engine blades and vanes are typically exposed to increasingly hotter gas temperatures. However, the ability to operate at these extreme temperatures is limited by the mechanical strength of the materials from which the turbine components are manufactured, as they may undesirably oxidize and/or corrode when exposed to the combustion gases.

To improve oxidation and/or corrosion resistance and decrease surface temperature of the turbine components, a protective thermal barrier coating (TBC) may be applied on the component. For example, ceramic thermal barrier coatings (TBCs) are used on turbine components to increase temperature capability and efficiency of gas turbines. One ceramic TBC previously known in the art consists of a layer of 6-8 weight percent yttria-stabilized zirconia (7YSZ) deposited by an electron beam physical vapor deposition (EB-PVD) process or by plasma spray onto a metallic bond coat formed over the turbine component. Although 7YSZ is suitable for use as a TBC for certain engine operating temperature ranges, it may not be suitable for use in higher temperature ranges. In such case, other more advanced ceramic TBCs, such as those that consist of lanthanide-base oxides with the general formula $A_2B_2O_7$, including but not limited to gadolinium zirconate, $Gd_2Zr_2O_7$ or neodymium zirconate, $Nd_2Zr_2O_7$, may be employed. Another example is fully-stabilized cubic zirconia, such as 20 weight percent yttria-stabilized zirconia (20YSZ). These more advanced ceramic TBCs have lower thermal conductivity and, therefore, may provide better thermal insulation as compared to 7YSZ. However, these oxides have significantly lower fracture toughness than 7YSZ, which limits TBC cyclic life and erosion resistance.

Accordingly, there is a need for an improved TBC that has both high fracture toughness and a reduced thermal conductivity, as compared to the aforementioned conventional TBCs. Additionally, it is desirable for the improved TBC to also be capable of exhibiting corrosion resistance, sintering resistance, and/or high temperature stability when subjected to the combustion gases of the turbine component. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Thermal barrier coatings having application in the manufacture of turbine engine components are provided.

Thermal barrier coatings consist of a tantala-zirconia mixture that is stabilized with two or more stabilizers. An exemplary thermal barrier coating consists of, by mole percent: about 8% to about 30% $YO_{1.5}$; about 8% to about 30% $YbO_{1.5}$ or $GdO_{1.5}$ or combination thereof; about 8% to about 30% $TaO_{2.5}$; about 0% to about 10% $HfO_2$; and a balance of $ZrO_2$.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The inventive subject matter will hereinafter be described in conjunction with the following drawing figures, wherein like numerals denote like elements.

DETAILED DESCRIPTION

Figure 1:
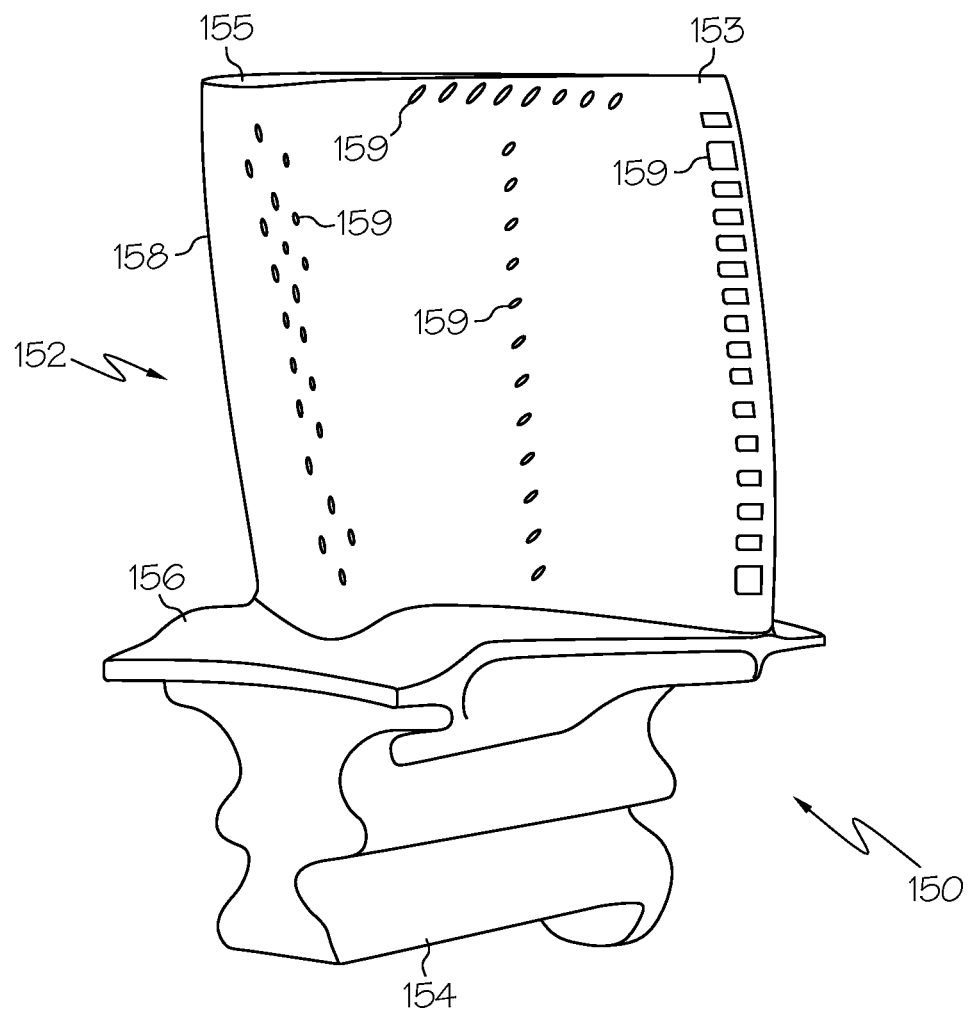
FIG. 1 is a perspective view of a turbine engine component, according to an embodiment.

The following detailed description is merely exemplary in nature and is not intended to limit the inventive subject matter or the application and uses of the inventive subject matter. Furthermore, there is no intention to be bound by any theory presented in the preceding background or the following detailed description.

A thermal barrier coating for use on a turbine engine component is provided that may have improved elevated-temperature properties as compared to conventional thermal barrier coatings. In an embodiment, the thermal barrier coating is formed from material having a particular chemical composition and structure. The chemistry and structure may provide improved properties to the thermal barrier coatings related to thermal insulation, fracture toughness, corrosion resistance, and/or erosion resistance over those of conventional thermal barrier coatings, when the material is exposed to extreme engine operating temperatures (e.g., temperatures greater than about 2000° F. (1093° C.)). In another embodiment, the particular chemistry and structure of the material comprising the thermal barrier coating may have improved phase stability over a temperature range within which an engine operates.

As initially noted above, the current state of the art TBC consists of 7YSZ. More advanced TBC may include additional compounds, such as gadolinia or tantala, to reduce thermal conductivity. These multi-compound coating are usually difficult to deposit, especially by physical vapor deposition, which is the preferred method to coat components of high pressure turbines. Difficulties may include undesirable variation of the distribution of the different elements throughout the TBC and/or complicated "multi-source" deposition processes. The described embodiments of the present disclosure are directed at achieving a desired set of TBC properties, such as thermal conductivity and toughness, improving coating uniformity and reducing the difficulty of depositing multi-compound TBCs.

In some embodiments of the present disclosure, a TBC is provided that consists of zirconia-tantala mixture doped with two or more stabilizers. Stabilizers (also called dopants) are commonly known as elements that that allow to retain stable tetragonal zirconia during service. A further aspect of the presently described embodiments is that the TBC is composed of one or more oxide phases one of which is co-doped tetragonal zirconia, which is known to have high fracture toughness. According to the published literature, tetragonal zirconia can be achieved in tantala-rich compositions. Thus, one example in accordance with the present disclosure consists of zirconia stabilized with yttria and ytterbia, or yttria and gadolinia, or ytterbia and gadolinia, and also contains tantala. The effect of the second stabilizer is a significant reduction of compositional variations across TBC thickness and more strain compliant microstructure, which provides significant life improvement of the coating. Besides, such combination of compounds produces a desirable combination of low thermal conductivity and improved fracture toughness. Other combinations may include zirconia-tantala mixture with three stabilizers, for example, yttria-ytterbia-gadolinia.

The described embodiments allow for the production of the multi-stabilizer TBC by physical vapor deposition technique, similar to the current state-of-the-art TBCs. It has been demonstrated that the multi-stabilizer compositions can be successfully deposited by evaporating pre-formulated oxide mixture from a single source, which makes it practical and suitable for simultaneous treatment of several parts. The same composition can also be deposited using other known methods, including conventional plasma spray.

Turning now to the Figures, FIG. 1 illustrates a turbine engine component 150, according to an embodiment. Here, the turbine engine component 150 is shown as turbine blade. However, in other embodiments, the turbine engine component 150 may be a turbine vane or other component that may be implemented in a gas turbine engine, or other high-temperature system. In an embodiment, the turbine engine component 150 includes an airfoil 152 including a pressure side surface 153, an attachment portion 154, a leading edge 158 including a blade tip 155, and a platform 156. In accordance with an embodiment, the component 150 may be formed with a non-illustrated outer shroud attached to the tip 155. The turbine engine component 150 may have non-illustrated internal air-cooling passages that remove heat from the turbine airfoil. After the internal air has absorbed heat from the superalloy blade, the air is discharged into a combustion gas flow path through passages 159 in the airfoil wall. Although the turbine engine component 150 is illustrated as including certain parts and having a particular shape and dimension, different shapes, dimensions and sizes may be alternatively employed depending on particular gas turbine engine models and particular applications. While a turbine blade is illustrated in FIG. 1, it will be appreciated that the TBCs described herein will have application in a variety of turbine engine components wherein it is either required or desirable to have a thermal barrier provided.

Figure 2:
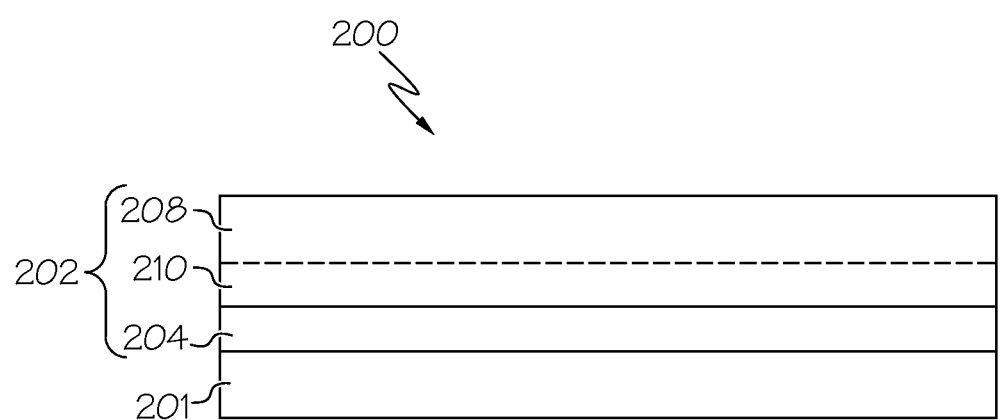
FIG. 2 is a simplified cross-sectional of a turbine engine component, according to an embodiment.

FIG. 2 is a cross-sectional view of a portion of a component 200, according to an embodiment. The component 200 may be, for example, a turbine airfoil such as the turbine blade shown in FIG. 1 (or any other suitable turbine engine component) and may include a protective coating system 202 disposed over a substrate 201. In an embodiment, the protective coating system 202 may include a bond coating 204, a thermal barrier coating 208, and one or more intermediate layers therebetween, such as a thermally grown oxide (TGO) 210, or such as an intermediate layer of TGO and 7YSZ. Further, layer 210 may include 7YSZ alone or in combination with a TGO.

The substrate 201 may be fabricated as a single crystal superalloy component from a single crystal superalloy material. A "single crystal superalloy material" may be defined as a superalloy material formed to have a single crystallographic orientation throughout its entirety and being substantially free (e.g., less than about 1%) of high angle boundaries. Suitable single crystal superalloy materials include, but are not limited to nickel-based superalloys, cobalt-based superalloys, and the like. The substrate 201 may alternatively be fabricated as a polycrystalline superalloy material.

The bond coating 204 is formed over the substrate 201 and bonds the thermal barrier coating 208 and/or another layer to the substrate 201. In an embodiment, the bond coating 204 may be a diffusion aluminide coating. In another embodiment, the bond coating 204 may be an overlay coating comprising MCrAlX, wherein M is an element selected from cobalt, nickel, or combinations thereof and X is an element selected from hafnium, zirconium, yttrium, tantalum, rhenium, ruthenium, palladium, platinum, silicon, or combinations thereof. The bond coating 204 may have a thickness in a range of from about 25 μm to about 150 μm, according to an embodiment. In other embodiments, the thickness of the bond coating 204 may be greater or less. In other embodiments, the bond coating 204 may be an intermetallic aluminide such as nickel aluminide or platinum aluminide. The aluminide bond coat can be applied by standard commercially available processes whereby aluminum is reacted at the substrate surface to form an aluminum intermetallic compound, which provides a reservoir for the growth of an alumina scale oxidation resistant layer. Thus the aluminide bond coating is predominately composed of aluminum intermetallic (e.g., NiAl, CoAl and (Ni, Co) Al phases) formed by reacting aluminum vapor species, aluminum rich alloy powder or surface layer, with the substrate elements in the outer layer of the superalloy component. This layer is typically well bonded to the substrate. Aluminizing may be accomplished by one of several conventional prior art techniques, such as the pack cementation process, spraying, chemical vapor deposition, electrophoresis, sputtering, and appropriate diffusion heat treatments. Other beneficial elements can also be incorporated into diffusion aluminide coatings by a variety of processes. Beneficial elements include, for example, Pt, Pd, Si, Hf, Y and oxide particles, such as alumina, yttria, hafnia, for enhancement of alumina scale adhesion, Cr and Mn for hot corrosion resistance, Ta, and Nb for diffusional stability and/or oxidation resistance and Ni and Co for increasing ductility or incipient melting limits. In the specific case of platinum modified diffusion aluminide coating layers, the coating phases adjacent to the alumina scale will be platinum aluminide and/or nickel-platinum aluminide phases (on a Ni-base superalloy).

The thermal barrier coating 208 is formed over the substrate 201, and in an embodiment, may be formed over the bond coating 204. In an embodiment, a majority of the thermal barrier coating 208 may be formed from a multi-phase material in order to provide improved properties of the thermal barrier coating 208 related to thermal insulation, fracture toughness, corrosion and/or erosion resistance over those of conventional thermal barrier coatings when the material is exposed to extreme engine operating temperatures. As used herein, the term "multi-phase material" may be defined as a material comprising three or more constituents that, when combined together and subjected to particular heat treatment processes, may form two or more phases. As used herein, the term "phase" may be defined as a region of a material that is chemically and structurally uniform and distinct. According to an embodiment the three or more constituents may comprise phases, where each is a binary oxide or a more complex oxide compound or solid solution.

The thermal barrier coating 208 in one embodiment may consist of essentially one phase, for example, tetragonal zirconia phase, which is known to have high fracture toughness. According to the published literature, single-phase tetragonal phase may be achieved by co-doping zirconia with equal molar concentrations of tantala and rare earth oxides, such as yttria, gadolinia or ytterbia.

In the other example, the chemical composition of the thermal barrier coating 208 is selected such that the TBC consists of more than one phase. Examples of the second, third, etc. phases include but not limited to various tantalates, such as $YTaO_4$, or cubic zirconia, or orthorhombic phase, such as $Zr_6Ta_2O_{17}$. For example, one phase may be selected for high fracture toughness, another phase may be selected for low thermal conductivity, and/or other phases (if included) may be selected for corrosion resistance, erosion resistance or the like. In another embodiment, each phase may have varying degrees of a certain desirable property. In accordance with an embodiment, the phases are selected such that they have limited solubility in each other and do not react with each other to form only one compound or a solid solution during deposition or during subsequent operation of the component. In this way, the thermal barrier coating may retain structural stability and remain multi-phase. To provide the two or more aforementioned properties, the phases may comprise different oxide compounds. In an example, the oxide compounds may comprise either binary oxides or more complex oxides consisting of two or more metallic elements and oxygen.

As initially noted above, the thermal barrier coatings in accordance with the present disclosure consist of a tantala-zirconia mixture that is stabilized with two or more stabilizers. In some TBC compositions, yttria and ytterbia are selected as the two or more stabilizers. Thus, in one embodiment, the TBC may consist of (all percentages given herein in mole-percent) about 1% to about 30% $YO_{1.5}$ (yttria), about 1% to about 30% $YbO_{1.5}$ (ytterbia), about 1% to about 30% $TaO_{2.5}$ (tantala), about 0% to about 10% $HfO_2$ (hafnia) (it will be appreciated by those having ordinary skill in the art that the presence of hafnia in zirconia-based compositions may be unavoidable as an impurity in an amount of up to about 10%), and a balance of $ZrO_2$ (zirconia). In another embodiment, the TBC may consist of about 5% to about 30% $YO_{1.5}$, about 5% to about 30% $YbO_{1.5}$, about 5% to about 30% $TaO_{2.5}$, about 0.1% to about 10% $HfO_2$, and a balance of $ZrO_2$. In yet another embodiment, the TBC may consist of about 10% to about 15% $YO_{1.5}$, about 10% to about 15% $YbO_{1.5}$, about 10% to about 20% $TaO_{2.5}$, about 0.1% to about 2% $HfO_2$, and a balance of $ZrO_2$.

In other TBC compositions, yttria and gadolinia are selected as the two or more stabilizers. Thus, in one embodiment, the TBC may consist of about 1% to about 30% $YO_{1.5}$, about 1% to about 30% $GdO_{1.5}$ (gadolinia), about 1% to about 30% $TaO_{2.5}$, about 0% to about 10% $HfO_2$, and a balance of $ZrO_2$. In another embodiment, the TBC may consist of about 5% to about 30% $YO_{1.5}$, about 5% to about 30% $GdO_{1.5}$, about 5% to about 30% $TaO_{2.5}$, about 0.1% to about 10% $HfO_2$, and a balance of $ZrO_2$. In yet another embodiment, the TBC may consist of about 10% to about 15% $YO_{1.5}$, about 10% to about 15% $GdO_{1.5}$, about 10% to about 20% $TaO_{2.5}$, about 0.1% to about 2% $HfO_2$, and a balance of $ZrO_2$.

In other TBC compositions, ytterbia and gadolinia are selected as the two or more stabilizers. Thus, in one embodiment, the TBC may consist of about 1% to about 30% $YbO_{1.5}$, about 1% to about 30% $GdO_{1.5}$ (gadolinia), about 1% to about 30% $TaO_{25}$, about 0% to about 10% $HfO_2$, and a balance of $ZrO_2$. In another embodiment, the TBC may consist of about 5% to about 30% $YbO_{1.5}$, about 5% to about 30% $GdO_{1.5}$, about 5% to about 30% $TaO_{2.5}$, about 0.1% to about 10% $HfO_2$, and a balance of $ZrO_2$. In yet another embodiment, the TBC may consist of about 10% to about 15% $YbO_{1.5}$, about 10% to about 15% $GdO_{1.5}$, about 10% to about 20% $TaO_{2.5}$, about 0.1% to about 2% $HfO_2$, and a balance of $ZrO_2$.

In still further TBC compositions, three stabilizers may be included, for example, yttria, ytterbia, and gadolinia. For example, in any of the embodiments described above, the mole percentage of ytterbia or gadolinia given may be represented as any combination (ratio) of ytterbia and gadolinia.

It will be appreciated that, in some embodiments, unavoidable trace and/or impurity constituents may be present. As used herein, the terms "trace" or "impurity" refer to constituents that are present in the composition in amount that are less than about 1% by mole, such as less than about 0.5% by mole. For example, such trace or impurity constituents may include, but are not limited to: titanium oxide, scandium oxide, cerium oxide, lanthanum oxide. Additionally, there may be trace impurities at less than about 0.1% by mole, for example less than about 0.05% by mole, such as: aluminum oxide, silicon oxide, magnesium oxide, and calcium oxide.

In accordance with an embodiment, the multi-stabilizer thermal barrier coating may be produced using an electron beam—physical vapor deposition (EB-PVD) process using one or more evaporation sources (ingots). Each ingot may consist of a separate oxide that may be either a pure (binary) oxide or a complex oxide, which has been selected for use as a starting material comprising a selected constituent. During deposition, electron beam(s) continuously or sequentially evaporates different ingots. Condensation of the oxides on a substrate produces a thermal barrier coating comprising a variety of different oxides. These oxides may already form one or more separate phases during deposition. Alternatively, post-deposition heat treatment may be used to precipitate oxide phases according to the corresponding equilibrium (and/or metastable) phase diagram. The amount and the distribution of individual oxides throughout a thickness of the thermal barrier coating can be varied by selecting specific electron beam dwell time per ingot, distance between the ingot and the part, electron beam power density and scan pattern. When deposited via EB-PVD, in some embodiments, the thickness of the TBC 208 may be in a range of from about 25 µm to about 300 µm. Further, when deposited via EB-PVD, TBC 208 may exhibit a columnar microstructure. These "columns" are oriented substantially perpendicular to the surface of the substrate 201 and extend outward from the bond coat 204. Between the individual columns are micron and sub-micron sized intercolumnar gaps that extend throughout TBC.

In accordance with another embodiment, the thermal barrier coating may be produced using air plasma spray (APS) techniques or directed vapor deposition techniques, among other suitable deposition techniques known in the art. In embodiments wherein APS or other deposition techniques are employed, it is expected that the above-described columns will not be present in the TBC. Rather, the TBC will exhibit a polycrystalline structure that may include a plurality of inter-splat gaps, as is known in the art. When deposited via APS, in some embodiments, the thickness of the TBC 208 may be in a range of from about 50 µm to about 1000 µm.

Illustrative Example

The present disclosure is now illustrated by the following non-limiting example. It should be noted that various changes and modifications can be applied to the following example and processes without departing from the scope of this invention, which is defined in the appended claims. Therefore, it should be noted that the following example should be interpreted as illustrative only and not limiting in any sense.

A thermal barrier coating was prepared in accordance with the foregoing description. The thermal barrier coating was tested for thermal conductivity. The example thermal barrier coating exhibited a thermal conductivity of about 1.1 to about 1.4 W/(m*K), which compares favorably to standard 7YSZ coatings, which typically exhibit thermal conductivities in the range of about 2.0 to about 2.3 W/(m*K). Other comparable products in the patent literature have disclosed thermal conductivities that are lower than observed by the inventors herein with regard to the present disclosure, for example in the range of about 0.9 to about 1.3 W/(M*k); however, as will be discussed in the next paragraph, these comparable products detrimentally exhibit a poor fracture toughness.

The example thermal barrier coating was also tested for fracture toughness. The example thermal barrier coating exhibited a fracture toughness of about 28 to about 30 J/m$^2$, which compares fairly well with the standard 7YSZ, which has a fracture toughness in the range of about 37 to about 43 J/m$^2$. In sharp contrast, the above noted comparable products in the literature, which had relatively low thermal conductivities, have detrimentally low fracture toughness.

Accordingly, thermal barrier coating has been provided that has both high fracture toughness and a reduced thermal conductivity, as compared to conventional thermal barrier coatings such as 7YSZ and as compared to comparable products in the literature. The improved thermal barrier coating may be capable of exhibiting corrosion resistance, sintering resistance, and/or high temperature stability when subjected to the combustion gases of the turbine component.

While at least one exemplary embodiment has been presented in the foregoing detailed description of the inventive subject matter, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter. It being understood that various changes may be made in the function and arrangement of elements described in an exemplary embodiment without departing from the scope of the inventive subject matter as set forth in the appended claims.

What is claimed is:

1. A thermal barrier coating composition consisting of, by mole percent:
   about 8% to about 30% $YO_{1.5}$;
   about 8% to about 30% $YbO_{1.5}$;
   about 8% to about 30% $TaO_{2.5}$;
   about 0% to about 10% $HfO_2$; and
   a balance of $ZrO_2$, and trace impurities at less than 0.5%,
   wherein the thermal barrier coating composition is a multi-phase material comprising a tetragonal zirconia phase and at least one additional phase selected from the group consisting of: a tantalate phase, a cubic zirconia phase, and an orthorhombic phase, and wherein the tetragonal zirconia phase and the at least one additional phase are non-reactive with one another and remain as separate phases in the thermal barrier coating composition.

2. The thermal barrier coating composition of claim 1 consisting of, by mole percent:
   about 10% to about 30% $YO_{1.5}$;
   about 10% to about 30% $YbO_{1.5}$;
   about 10% to about 30% $TaO_{2.5}$;
   0.1% to about 10% $HfO_2$; and
   a balance of $ZrO_2$, and trace impurities at less than about 0.1%.

3. The thermal barrier coating composition of claim 2 consisting of, by mole percent:
   about 10% to about 15% $YO_{1.5}$;
   about 10% to about 15% $YbO_{1.5}$;
   about 10% to about 20% $TaO_{2.5}$;
   0.1% to about 2% $HfO_2$; and
   a balance of $ZrO_2$, and trace impurities at less than about 0.05%.

4. The thermal barrier coating composition of claim 1 disposed in a layer on an airfoil, wherein a thickness of the layer is from about 1 micron to about 1500 microns.

5. The thermal barrier coating composition of claim 1 disposed in a layer on a turbine component, wherein a thickness of the layer is from about 25 to about 300 microns, and wherein the thermal barrier coating is deposited using EB-PVD.

6. The thermal barrier coating composition of claim 1 disposed in a layer on a turbine component, wherein a thickness of the layer is from about 25 to about 1000 microns, and wherein the thermal barrier coating is deposited using APS.

7. The thermal barrier coating composition of claim 1 disposed in a layer on a turbine component, wherein a microstructure of the layer is columnar, and wherein the layer is deposited using EB-PVD.

8. The thermal barrier coating composition of claim 1 disposed in a layer on a turbine component, wherein a microstructure of the layer is polycrystalline.

9. The thermal barrier coating composition of claim 1 disposed in a layer on a turbine component, wherein a microstructure of the layer has a plurality of inter-splat gaps, and wherein the layer is deposited using APS.

10. A turbine engine component comprising:
a substrate;
a bond coating provided over the substrate; and
a thermal barrier coating composition provided over the bond coating, with the proviso that the thermal barrier coating composition is provided only in a single layer, wherein the thermal barrier coating composition consists of, by mole percent:
about 8% to about 30% $YO_{1.5}$;
about 8% to about 30% $YbO_{1.5}$;
about 8% to about 30% $TaO_{2.5}$;
about 0% to about 10% $HfO_2$; and
a balance of $ZrO_2$, and trace impurities at less than 0.5%, wherein the thermal barrier coating composition is a multi-phase material comprising a tetragonal zirconia phase and at least one additional phase selected from the group consisting of: a tantalate phase, a cubic zirconia phase, and an orthorhombic phase, and wherein the tetragonal zirconia phase and the at least one additional phase are non-reactive with one another and remain as separate phases in the thermal barrier coating composition.

11. The turbine engine component of claim 10, wherein the thermal barrier coating consists of, by mole percent:
about 10% to about 15% $YO_{1.5}$;
about 10% to about 15% $YbO_{1.5}$;
about 10% to about 20% $TaO_{2.5}$;
0.1% to about 2% $HfO_2$; and
a balance of $ZrO_2$, and trace impurities at less than about 0.1%.

12. The turbine engine component of claim 10, wherein the at least one additional phase is at least the tantalate phase and comprises $YTaO_4$.

13. The turbine engine component of claim 10, wherein the at least one additional phase is at least the cubic zirconia phase.

14. The turbine engine component of claim 10, wherein the at least one additional phase is at least the orthorhombic phase and comprises $Zr_6Ta_2O_{17}$.

* * * * *